United States Patent [19]

Norioka et al.

[11] 4,439,681

[45] Mar. 27, 1984

[54] CHARGED PARTICLE BEAM SCANNING DEVICE

[75] Inventors: Setsuo Norioka; Naoki Date, both of Akishimashi, Japan

[73] Assignee: Jeol Ltd., Tokyo, Japan

[21] Appl. No.: 312,955

[22] Filed: Oct. 20, 1981

[30] Foreign Application Priority Data

Oct. 24, 1980 [JP] Japan .................................. 55-149165

[51] Int. Cl.$^3$ .............................................. H01J 37/26
[52] U.S. Cl. ..................................... 250/310; 250/397
[58] Field of Search ................. 250/310, 311, 396, 397

[56] References Cited

U.S. PATENT DOCUMENTS 3,795,808   3/1974   Drayton et al. ..................... 250/310
3,900,734   8/1975   Kynaston et al. ................... 250/311
4,057,722  11/1977   Hieke ................................. 250/311

Primary Examiner—Bruce C. Anderson
Attorney, Agent, or Firm—Webb, Burden, Robinson & Webb

[57] ABSTRACT

A charged particle beam scanning device is provided with two coordinates conversion circuits. For rotating the scanning direction of the charged particle beam, one of the coordinates conversion circuit is connected between a scanning signal generator and a magnification circuit, the output of which is supplied to a deflecting means for scanning the charged particle beam over the specimen surface, as in the case of a conventional device. Another coordinates conversion circuit is used for keeping independent operation of the image rotation and the image shift. This coordinates conversion circuit converts the output signal of a d.c. signal generator for image shift, and the converted signal is added to the input signal of the said magnification circuit.

5 Claims, 9 Drawing Figures

CHARGED PARTICLE BEAM SCANNING DEVICE

BACKGROUND

This invention relates generally to a specimen image display apparatus for use in a scanning electron microscope or similar type instrument, and more particularly to a charged particle beam scanning apparatus for facilitating changeover from an initially displayed specimen image to a desired field of view of said specimen image.

In an apparatus having a scanning function, such as a scanning electron microscope, an electron beam exposure device or the like, the electron beam irradiates and scans over a selected area of the specimen surface, the signal resulting from said electron beam irradiation being used as a brightness modulation signal for an image display means synchronized with said scanning electron beam. The magnification and field of view of the specimen image displayed on said display means depends on the extent and position of the electron beam scanning area on the specimen surface. Accordingly, it is necessary to adjust the electron beam deflecting (scanning) signal and/or the specimen goniometer stage (including shifting, rotating, and tilting mechanism) in order to irradiate the desired area on the specimen surface with the electron beam. This involves determining the desired field of view using a low magnification image, adjusting the electron beam scanning signal and/or specimen goniometer stage so as to display the desired point (small area) on the low magnification image at the approximate center of the viewing screen, and reducing the magnitude or amplitude of the scanning signal so as to display a higher magnification image on the viewing screen. Generally, the above procedure has to be repeated several times in order to observe the desired field of view, which makes it time consuming and troublesome. Particularly, it is very difficult to manually operate the specimen goniometer stage smoothly and precisely. In order to eliminate this difficulty, a beam scanning device for controlling the image shift and rotation electrically without operation of the shifting and rotating mechanism of the specimen goniometer stage is used. However, the electrical image shifting function and the electrical image rotating function of the conventional scanning device cannot be used at the same time, because these functions are interdependent.

It is therefore an object of this invention to provide an improved scanning device in which the image shifting function and the image rotating function are incorporated independently to each other.

Another object of this invention is to provide an improved scanning device for selecting the field of view of the specimen image quickly and precisely.

SUMMARY OF THE INVENTION

Briefly, according to this invention, a charged particle beam scanning device is provided with two coordinates conversion circuits. For rotating the scanning direction of a charged particle beam, one of the coordinates conversion circuits is connected between a scanning signal generator and a magnification circuit, the output of which is supplied to a deflecting means for scanning the charged particle beam over the specimen surface, as in the case of a conventional device. Another coordinates conversion circuit is used for keeping independent operation of the image rotation and the image shift. This coordinates conversion circuit converts the output signal of a d.c. signal generator for image shift, and the converted signal is added to the input signal of the magnification circuit.

DESCRIPTION OF THE PREFERRED EMBODIMENT

Figure 1:
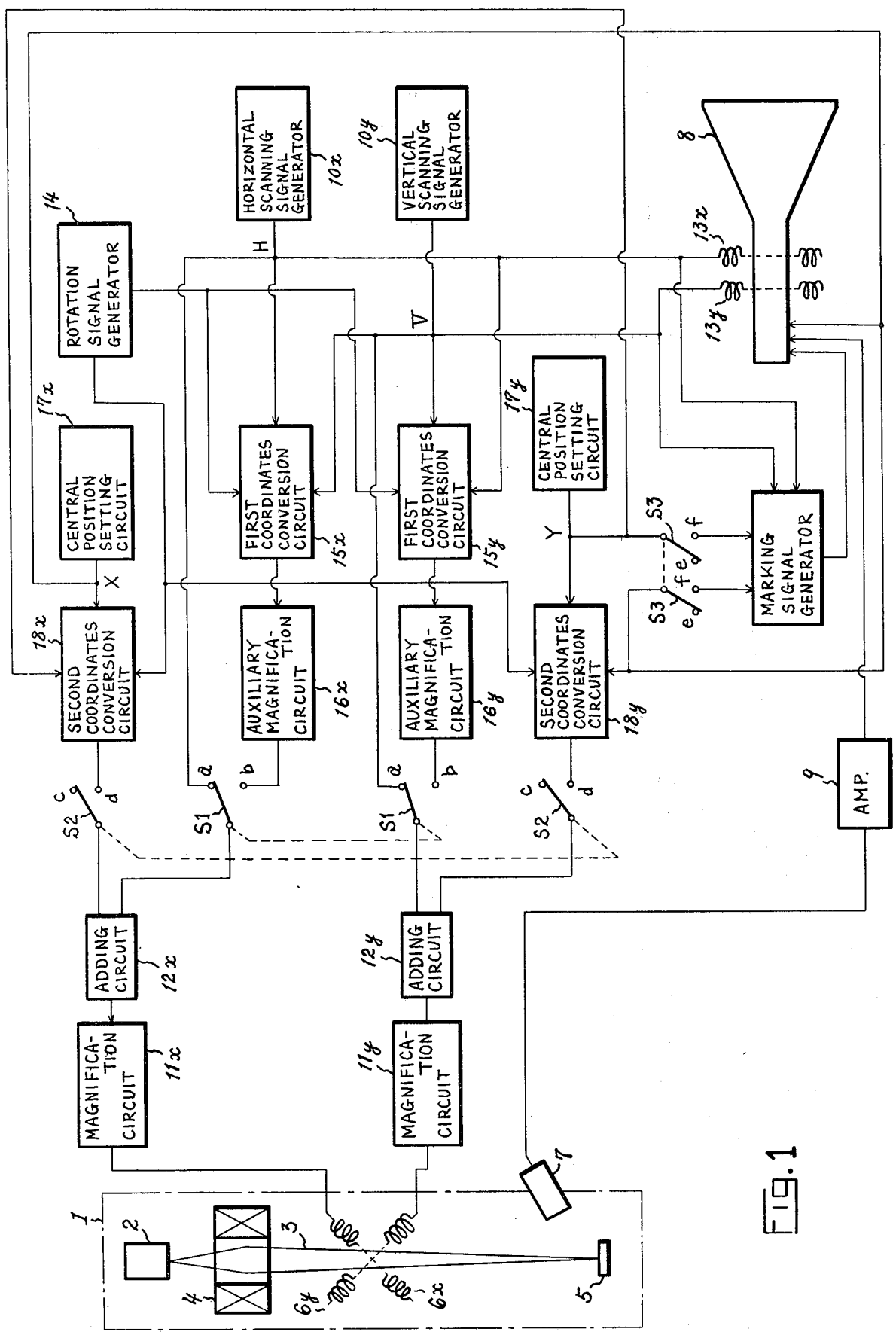
FIG. 1 is a schematic drawing showing one embodiment according to the invention.

FIG. 1 is a block diagram of a scanning electron microscope incorporating a scanning device according to this invention. An electron gun 2 disposed at the upper end of a microscope column 1 generates an electron beam 3 which is focused on a specimen 5 by a condenser lens 4 and scans the specimen surface by means of scanning deflection coils 6x, 6y. Upon such scanning, secondary electrons, backscattered electrons and thhe like are emitted from the specimen 5 and detected by a detector 7 which supplies signals to the grid of a cathode ray tube (CRT) 8 via an amplifier 9.

When it is desired to display a usual (initial) scanning image on the screen of the CRT 8, changeover switches S1, S2, and S3 are connected to the terminals "a", "c" and "e" respectively. At the same time, a horizontal scanning signal generating circuit 10x and a vertical scanning signal generator 10y supply horizontal and vertical scanning signals respectively to the scanning deflection coils 6x, 6y via magnification circuits 11x, 11y and adding circuits 12x, 12y, and also synchronously to scanning deflection coils 13x, 13y of the CRT 8.

In the embodiment of FIG. 1, a rotation signal generator 14 generates signals $\sin \theta$ and $\cos \theta$, where $\theta$ is a (manually or externally) designated signal for rotating the scanning direction of the electron beam 3 about the center of the initial scanning area on the specimen through the angle $\theta$. The outputs of the rotation signal generator 14 are fed to first coordinates conversion circuits 15x, 15y which convert horizontal scanning signal H from the horizontal scanning signal generator 10x and vertical scanning signal V from the vertical scanning signal generator 10y into (H·cos $\theta$ + V·sin $\theta$) and (V·cos $\theta$ − H·sin $\theta$) respectively. These converted outputs of the circuits 15x, 15y are then supplied to auxiliary magnification circuits 16x, 16y, the amplitude ($\leq 1$) of which is manually controlled so that the desired size area within the initial scanning image on the CRT screen is zoomed up to completely fill the CRT screen.

Central position setting circuit 17x, 17y generate d.c. output signals X, Y which are supplied to second coordinates conversion circuits 18x, 18y. The second coordinates conversion circuits 18x, 18y are also supplied with the outputs $\sin \theta$, $\cos \theta$ from the rotation signal generator 14 to effect coordinates conversion of the outputs X, Y from the central position setting circuits 17x, 17y into signals (X·cos $\theta$ + Y·sin $\theta$), (Y·cos $\theta$ − X·sin $\theta$) which are fed to the adding circuits 12x, 12y, respectively, via terminals "d" of the switches S2. The signals X, Y from the central position setting circuits 17x, 17y are also fed to a marking signal generator 19 via terminals "f" of the switches S3. The marking signal generator 19 generates bright-up signals fed to the CRT 8 at the time when the horizontal scanning signal H substantially equals signal X and the vertical scanning signal V substantially equals signal Y.

Figure 2A:
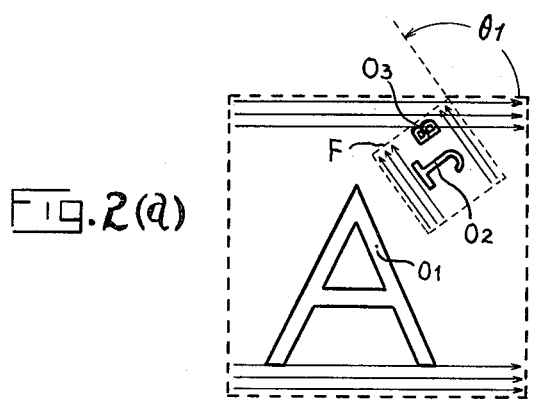
FIGS. 2(a)-(d) and 3(a)-(d) are the schematic drawings for explaining the operation of the embodiment shown in FIG. 1.
Figure 3A:
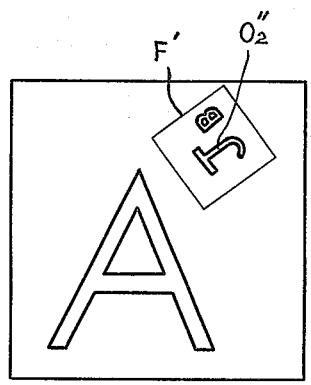

With the above embodiment, it is assumed that the initial scanning image with initial magnification $M_o$ on the CRT screen as shown in FIG. 3(a) is obtained when the surface of the specimen 5 is scanned about its central point $0_1$ with the electron beam as shown in FIG. 2(a). In this case, the switches S1, S2, S3 are connected to the terminals "a", "c", "e", respectively, and the rotation signal generator 14 is set to signal $\theta = 0°$.

Figure 3B:
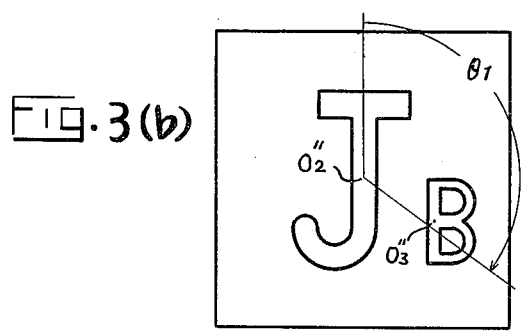

The scanning image shown in FIG. 3(b) is zoomed up from a portion F', a center of which is shown by $0''_2$ in FIG. 3(a). For obtaining the image shown in FIG. 3(b), the following operating steps are necessary so that a portion F on the specimen shown in FIG. 2(a) corresponding to the said portion F' on the initial image shown in FIG. 3(a) is scanned about its central point $0_2$ with an electron beam at an amplitude corresponding to the magnification $M_1 (\geq M_o)$ and in a direction extending at angle $\theta_1$ with respect to the horizontal direction:

(1) The switches S3 are connected to the terminals "f" so that the bright-up spot (area) on the CRT screen is displayed within the scanning image shown in FIG. 3(a).

(2) The position of the bright-up spot is shifted to $0''_2$ by adjusting the central position setting circuits 17x, 17y. By so doing the output signals of the central position setting circuits 17x, 17y correspond to the coordinates $(X_1, Y_1)$ of the point $0_2$.

Figure 2B:
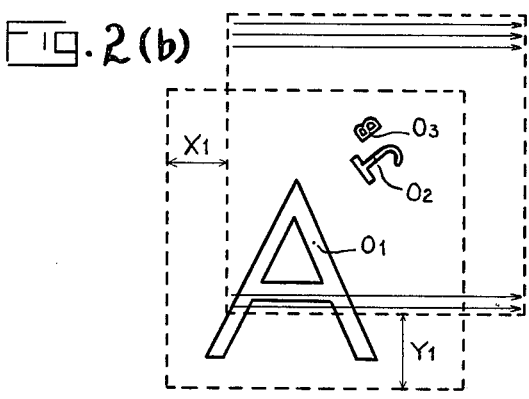

(3) The switches S3, S2 are connected to the terminals "e", "d" respectively. Under this condition, the bright-up spot on the CRT screen is extinguished and the scanning area on the specimen is shifted as shown in FIG. 2(b).

Figure 2C:
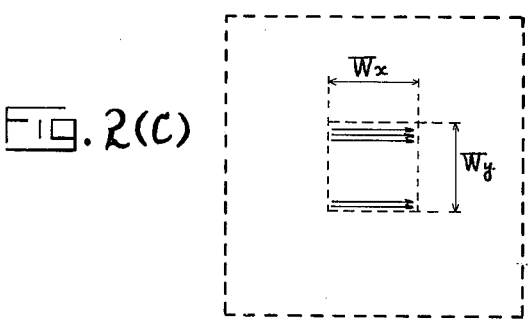

(4) The switches S1 are connected to the terminals "b", and the amplitude of the auxiliary magnification circuits 16x, 16y is adjusted to $$\frac{M_o}{M_1} (\leq 1)$$

so that the scanning widths $W_x$, $W_y$ on the specimen 5 are reduced as shown in FIG. 2(c).

Figure 2D:
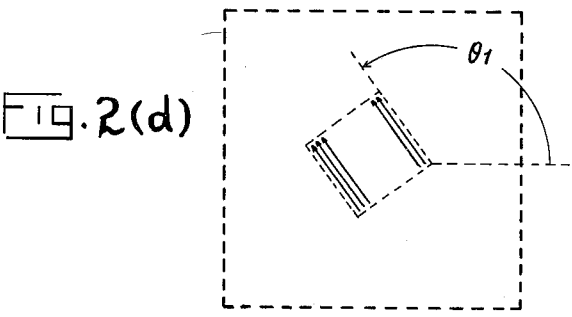

(5) The rotation signal generator 14 is manually controlled so that the output signals sin 0°, cos 0°, sin $(0° + \theta_1)$, cos $(0° + \theta_1)$ are delivered to the second coordinates conversion circuits 18x, 18y and first coordinates conversion circuits 15x, 15y, respectively. As a result, the outputs of the auxiliary magnification circuits 16x, 16y become $$\frac{M_o}{M_1}(H \cdot \cos\theta_1 + V \cdot \sin\theta_1), \frac{M_o}{M_1}(V \cdot \cos\theta_1 - H \cdot \sin\theta_1)$$

respectively, and the outputs of the second coordinates circuits 18x, 18y become $X_1 \cdot \cos 0° + Y_1 \cdot \sin 0° = X_1$, $Y_1 \cdot \cos 0° - X_1 \cdot \sin 0° = Y_1$, respectively. Under this condition, the specimen 5 is scanned by the electron beam as shown in FIG. 2(d), and the image shown in FIG. 3(b) is displayed on the CRT screen.

Figure 3C:
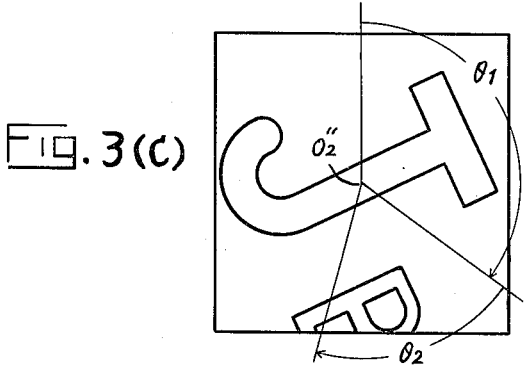

When it is desired to rotate the specimen image shown in FIG. 3(b) through an additional angle $\theta_2$ and to increase magnification from $M_1$ to $M_2$ as shown in FIG. 3(c), the following operating steps are necessary.

(6) The amplitude of the auxiliary magnification circuits 16x, 16y is adjusted to $$\frac{M_o}{M_2}\left(<\frac{M_o}{M_1}\right).$$

(7) The rotation signal generator 14 is manually controlled so that the output signals sin 0°, cos 0°, sin $\{(0°+\theta_1)+\theta_2\}$, cos $\{(0°+\theta_1)+\theta_2\}$ are delivered to the second and first coordinates conversion circuits 18x, 18y, 15x, 15y, respectively. As a result, the outputs of the auxiliary magnification circuits 16x, 16y become $$\frac{M_o}{M_2}\{H \cdot \cos(\theta_1 + \theta_2) + V \cdot \sin(\theta_1 + \theta_2)\},$$

$$\frac{M_o}{M_2}\{V \cdot \cos(\theta_1 + \theta_2) - H \cdot \sin(\theta_1 + \theta_2)\}$$

respectively, and the outputs of the second coordinate circuits 18x, 18y become $X_1 \cdot \cos 0° + Y_1 \cdot \sin 0°$, $Y_1 \cdot \cos 0° - X_1 \cdot \sin 0°$, respectively.

Figure 3D:
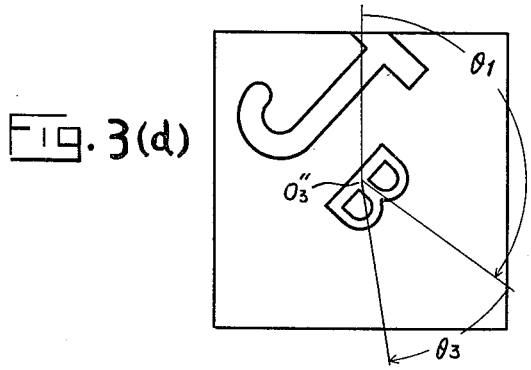

Further, when it is desired to rotate the specimen image shown in FIG. 3(b) about a point $0''_3$ through an additional angle $\theta_3$ as shown in FIG. 3(d), the following operating steps are necessary.

(6') The central position setting circuits 17x, 17y are adjusted so as to shift the point $0''_3$ on the image to the center of the CRT screen. Under this condition, the outputs of the second coordinates circuits 18x, 18y becomes $X_2 \cdot \cos\theta_1 + Y_2 \cdot \sin\theta_1$, $Y_2 \cdot \cos\theta_1 - X_2 \cdot \sin\theta_1$, respectively, where $X_2$ and $Y_2$ are distances from $0_1$ to $0_3$.

(7') The rotation signal generator 14 is manually controlled so that the outputs signal sin $(\theta_1+\theta_3)$, cos $(\theta_1+\theta_3)$ are delivered to the first coordinates conversion circuits 15x, 15y. As a result, the outputs of the auxiliary magnification circuits 16x, 16y become $$\frac{M_o}{M_1}\{H \cdot \cos(\theta_1 + \theta_3) + V \cdot \sin(\theta_1 + \theta_3)\},$$

$$\frac{M_o}{M_1}\{V \cdot \cos(\theta_1 + \theta_3) - H \cdot \sin(\theta_1 + \theta_3)\}$$

respectively.

Modifications and variations of this invention are possible in the light of the above description. For example, the electron beam irradiating the specimen may be deflected electrostatically instead of electromagnetically. And the auxiliary magnification circuits 16x, 16y and the first coordinates conversion circuits 15x, 15y may replace each other in the above mentioned embodiment. Further, it may be preferable to control the rotation signal generator 14 using a microprocessor.

Having thus described the invention with the detail and particularity required by the Patent Laws, what is desired protected by Letters Patent is set forth in the following claims.

We claim:

1. A charged particle beam scanning device enabling the beam to be scanned in a raster over the surface of a specimen such that the size of the raster and/or the angular orientation of the raster and/or the center of the raster can be changed relative to the specimen without moving the specimen, said scanning device comprising:

(a) a scanning signal generator for generating two repetitive scanning signals, (b) a charged particle beam deflecting means responsive to said scanning signals for deflecting the charged particle beam over the specimen surface in a raster defined by horizontal and vertical scanning directions, (c) magnification means for adjusting the length of scan of the charged particle beam over the specimen as produced by the deflecting means by adjusting the amplitude of said scanning signals prior to application to said deflecting means, (d) a rotation signal generator for supplying rotation signals indicative of a desired rotation of the raster, (e) a first coordinates conversion circuit responsive to the scanning signals and the rotation signals for generating modified scanning signals for rotating the raster and scanning directions of the charged particle beam, (f) means for generating d.c. signals indicative of a desired shift of the center of the raster, (g) a second coordinates conversion circuit responsive to the signals indicative of a desired shift and the rotation signals for shifting the raster in the current scanning directions, and (h) means for adding the outputs of the first and second coordinates conversion circuits and applying said sum signal to said magnification circuit.

2. A charged particle beam scanning device according to claim 1 further comprising an auxiliary magnification circuit for adjusting the amplitude of the output of the first coordinate conversion circuit prior to application to the means for adding.

3. A charged particle beam scanning device comprising (a) a means for irradiating a specimen surface with the charged particle beam, (b) a scanning signal generator for generating scanning signals, (c) a deflecting means supplied with the scanning signals of the said scanning signal generator for deflecting the said charged particle beam over the specimen surface, (d) a main magnification circuit for adjusting the length of scan by adjusting the amplitude of the scanning signals prior to application to the deflecting means, (e) a means for detecting emissions from the specimen and providing an output signal indicative thereof, and (f) an image display means responsive to the scanning signals and the detecting means output signal for displaying a scanning image, (g) a rotation signal generator for supplying rotation signals to the said first and second coordinates conversion circuits, (h) a first coordinates conversion circuit connected between the said scanning signal generator and the said main magnification circuit by a switching means for rotating the scanning direction of the charged particle beam, (i) a d.c. signal generator for generating signals indicative of a desired shift of the center of the raster, (j) a second coordinates conversion circuit supplied with the output signals of said d.c. signal generator and said rotation signal generator for shifting the output scanning signal of the said scanning signal generator in the current scanning directions, (k) means for adding the output of the second coordinates conversion circuit to the input signal of the said main magnification circuit by a switching means, and (l) a marker signal generator for supplying a marker signal to the said image display means via a switching means as a result of the comparison between the scanning signal and the output of the said d.c. signal generator.

4. A charged particle beam scanning device according to claims 1, 2, or 3 wherein the first coordinates conversion circuit receives inputs H and V from the scanning signal generator indicative of horizontal and vertical scanning respectively and signals indicative of the rotation angle $(\phi+\theta)$ and the outputs of the first coordinates conversion circuit comprises $H \cdot \cos(\phi+\theta) + V \cdot \sin(\phi+\theta)$ and $V \cdot \cos(\phi+\theta) - H \cdot \sin(\phi+\theta)$ and second coordinates conversion circuit receives inputs X and Y indicative of the X and Y offsets respectively and signals indicative of rotation angle $\phi$ and the outputs of the second coordinates conversion circuit comprises $X \cdot \cos \phi + Y \cdot \sin \phi$ and $Y \cdot \cos \phi - X \cdot \sin \phi$ where $\phi$ is the past rotation angle applied to the first conversion circuit, and $\theta$ is the next rotation angle.

5. A charged particle beam scanning device according to claims 1, 2, or 3 wherein (a) the rotation signal generator supplies signals $\sin \alpha$ and $\cos \alpha$ to the first coordinates conversion circuit, and supplies signals $\sin \beta$ and $\cos \beta$ to the second coordinates conversion circuit, where $\alpha$ is changed always to the newly designated rotation angle from past rotation angle $\alpha_o$, and $\beta$ is maintained at the past rotation angle $\beta_o$ during the outputs of the d.c. signal generator is not changed, and is changed to the past rotation angle $\alpha_o$ at the time when the outputs of the d.c. signal generator is changed, (b) the first coordinates conversion circuit receives inputs H and V from the scanning generator indicative of horizontal and vertical scanning respectively and outputs the signals $H \cdot \cos \alpha + V \cdot \sin \alpha$ and $V \cdot \cos \alpha - H \cdot \sin \alpha$, and (c) the second coordinates conversion circuit receives inputs X and Y from the d.c. signal generator and outputs the signals $X \cdot \cos \beta + Y \cdot \sin \beta$ and $Y \cdot \cos \beta - X \cdot \sin \beta$.

* * * * *